US 6,649,077 B2

(12) United States Patent
Tsai et al.

(10) Patent No.: US 6,649,077 B2
(45) Date of Patent: Nov. 18, 2003

(54) METHOD AND APPARATUS FOR REMOVING COATING LAYERS FROM ALIGNMENT MARKS ON A WAFER

(75) Inventors: Pang-Yen Tsai, Kaohsiung (TW); Tien-Chen Hu, Pingtung (TW); Sen-Shan Yang, Tainan (TW); Wei-Cheng Ku, Tainan (TW)

(73) Assignee: Taiwan Semiconductor Manufacturing Co. Ltd, Hsin Chu (TW)

( * ) Notice: Subject to any disclaimer, the term of this patent is extended or adjusted under 35 U.S.C. 154(b) by 86 days.

(21) Appl. No.: 10/032,348

(22) Filed: Dec. 21, 2001

(65) Prior Publication Data

US 2003/0116535 A1 Jun. 26, 2003

(51) Int. Cl.$^7$ .......................... H01L 21/302; C23F 1/00
(52) U.S. Cl. .......................... 216/92; 216/100; 216/105; 216/106; 156/345.19; 156/345.23; 156/345.51; 156/915; 438/401; 438/748; 438/754; 438/975
(58) Field of Search .......................... 216/92, 100, 105, 216/106; 438/401, 748, 754, 975; 156/345.19, 345.23, 345.51, 915

(56) References Cited

U.S. PATENT DOCUMENTS

| 6,287,477 | B1 | * | 9/2001 | Hacker et al. ................. 216/83 |
| 6,290,631 | B2 | * | 9/2001 | Chu et al. .................... 438/692 |
| 6,303,458 | B1 | * | 10/2001 | Zhang et al. ................ 438/401 |
| 6,329,301 | B1 | * | 12/2001 | Zahorik et al. ............. 438/745 |
| 6,562,691 | B2 | * | 5/2003 | Chang et al. ................ 438/401 |
| 2003/0070755 | A1 | * | 4/2003 | Emami .................. 156/345.11 |
| 2003/0073309 | A1 | * | 4/2003 | Emami ........................ 438/689 |

* cited by examiner

Primary Examiner—Anita Alanko
(74) Attorney, Agent, or Firm—tung & Associates

(57) ABSTRACT

A method and an apparatus for removing coating layers from the top of alignment marks on a wafer situated in a spin processor are described. The method may be carried out by first providing a spin process equipped with a rotatable wafer pedestal, then providing a wafer that has at least one alignment mark covered by a coating layer, mounting an edge ring on an outer periphery of the wafer pedestal, the edge ring has at least one tab section extending outwardly from an inner periphery of the edge ring, then positioning the wafer faced down and supported by an inert gas flow on the edge ring such that a narrow gap is formed between the tab section on the edge ring and the alignment marks and dispensing an etchant onto a backside of the wafer while rotating.

17 Claims, 3 Drawing Sheets

METHOD AND APPARATUS FOR REMOVING COATING LAYERS FROM ALIGNMENT MARKS ON A WAFER

FIELD OF THE INVENTION

The present invention generally relates to a method and apparatus for removing coating layers from alignment marks on a wafer positioned in a spin processor and more particularly, relates to a method and apparatus for removing coating layers from alignment marks on a wafer by placing the wafer face down on an edge ring equipped with tab sections spaced-apart from the alignment marks such that an etchant for the coating layers can be drawn into the gap formed between the tab sections and the alignment marks to remove the coating layers by capillary action.

BACKGROUND OF THE INVENTION

Deposition and patterning are two of the basic steps performed in semiconductor processing. Patterning is also referred to as photolithography, masking, oxide or metal removal, and microlithography. Patterning enables the selective removal of material deposited on a semiconductor substrate, or wafer, as a result of deposition. For example, as shown in FIG. 1A, a layer 104 has been deposited on a substrate 102. After the photolithography process is performed, as shown in FIG. 1B, some parts of the layer 104 have been selectively removed, such that gaps 106a and 106b are present within the layer 104. A photomask, or pattern, is used (not shown in FIG. 1B) so that only the material from the gaps 106a and 106b are removed, and not the other portions of the layer 104. The process of adding layers and removing selective parts of them, in conjunction with other processes, permits the fabrication of semiconductor devices.

Alignment is critical in photolithography and deposition, as well as in other semiconductor processes. If layers are not deposited properly, or if they are not selectively removed properly, the resulting semiconductor devices may not function, relegating them to scrap, which can be costly. Therefore, alignment marks are placed on the semiconductor wafer for the proper positioning during the deposition and photolithography processes. This is shown in FIG. 2, where the semiconductor wafer 202 has alignment marks, such as the alignment square 204, thereon. When the photomask 206 is positioned over the wafer 202, its own alignment marks, such as the alignment square 208, is aligned with the alignment marks of the wafer 202. For example, the alignment square 208 of the photomask 206 is aligned so that the alignment square 204 of the wafer 202 is centered therein.

Alignment is especially critical where more a number of metal or other layers have already been deposited on the wafer. Subsequent deposition of silicon dioxide or other layers in such instances usually requires that the alignment marks on the wafer be exposed for proper overlay of the silicon dioxide or other layers. While a mask may prevent the layers themselves from obfuscating the alignment marks, the photoresist used to pattern or perform other processing of these layers cannot be masked, and covers or at least blurs the alignment marks. Without clear exposure of the alignment marks, however, overlay misalignment can result. Overlay misalignment is also referred to as overlay registration error. Misalignment is a serious problem, and can result in significant semiconductor wafer scrap. Wafer scrap can sometimes be reused, but often is discarded, resulting in added costs incurred by the semiconductor foundry.

In the recent development of semiconductor fabrication technologies, copper has been widely used in devices of 0.18 $\mu$m or smaller as vias or interconnects. A widely used technique for depositing copper on a semiconductor wafer is the electro-chemical plating method. However, when copper is deposited onto a wafer surface by the electro-chemical plating method, alignment marks on the wafer are also covered with copper and a layer of TaN which is a diffusion barrier for copper. If the Cu/TaN layers formed over the alignment marks are not removed completely in a later process, alignment failure can occur in a future photolithographic step.

Presently, a process of edge/bevel cleaning is used to remove a circular band of Cu/TaN at the wafer edge. This is shown in FIG. 3. Wafer 302, which has alignment marks 304 and 306 formed on an active surface 308, is cleaned by using a cleaning solution such that a circular band 310 of Cu/TaN at the wafer edge can be removed. Although the Cu/TaN layers over the alignment marks 304,306 are removed, the cleaning process inevitably results in severe die loss along the circular band 310. For instance, as shown in FIG. 3, IC dies 312~330 are all lost due to the Cu/TaN cleaning process.

It is therefore an object of the present invention to provide a method for removing coating layers from alignment marks on a wafer that does not have the drawbacks or shortcomings of the conventional methods.

It is another object of the present invention to provide a method for removing coating layers from alignment marks on a wafer positioned in a spin processor by mounting the wafer juxtaposed to an edge ring.

It is a further object of the present invention to provide a method for removing coating layers from alignment marks on a wafer by providing an edge ring that is equipped with at least one tab section for overlapping a corresponding alignment mark on the wafer.

It is another further object of the present invention to provide a method for removing coating layers from alignment marks on a wafer by suspending the wafer over a wafer pedestal by an inert gas flow and flowing an etchant onto the backside of the wafer while the wafer is rotated.

It is still another object of the present invention to provide a method for removing coating layers from alignment marks situated on a wafer by suspending the wafer over an edge ring such that a distance of less than 5 mm is kept between the wafer and the edge ring.

It is yet another object of the present invention to provide an apparatus for removing coating layers from alignment marks on a wafer which includes a spin processor, a rotatable wafer pedestal, an edge ring for mounting on the pedestal, a mechanical clamp for holding the wafer during rotation, a rotating means for rotating the wafer pedestal, and a nozzle for flowing an etchant onto a backside of the wafer.

SUMMARY OF THE INVENTION

In accordance with the present invention, a method and an apparatus for removing coating layers from alignment marks on a wafer are provided.

In a preferred embodiment, a method for removing coating layers from the top of alignment marks on a wafer positioned in a spin processor is provided which includes the steps of providing a spin processor equipped with a rotatable wafer chuck therein, the wafer chuck is provided with inert gas flow channels for flowing an inert gas in an upward direction; providing a wafer that has at least one alignment mark on an active surface, the at least one alignment mark is covered with a coating layer; mounting an edge ring on an outer periphery of the wafer chuck, the edge ring has at least one tab section extending outwardly from an inner periphery of the edge ring toward a center of the ring, each of the at least one tab section has an area sufficiently large to overlap one of the at least one alignment mark; positioning the wafer with the active surface in a faced down position on the edge ring supported by the inert gas flow from the inert gas flow channels such that each one of the at least one alignment mark on the wafer overlaps and suspends over each one of the at least one tab section on the edge ring by a preset distance of not more than 5 mm; and rotating the wafer chuck and the edge ring with the wafer suspended thereon and flowing an etchant onto a backside of the wafer such that the etchant is drawn into the gap to remove the coating layers by capillary action.

In the method for removing coating layers from the top of alignment marks on a wafer positioned in a spin processor, the coating layer on the alignment mark is an electroplated Cu layer. The method may further include the step of flowing $N_2$ gas upwardly through the wafer chuck to support the wafer suspended over the wafer chuck, or the step of clamping the wafer by a mechanical clamp during the rotating step, or the step of supporting the wafer suspended over the wafer chuck maintaining a distance between the wafer and the edge ring at between about 0.5 mm and about 5 mm. The method may further include the step of rotating the wafer chuck at a rotational speed between about 20 rpm and about 200 rpm, or the step of flowing an etchant that contains an acid selected from the group consisting of $H_2SO_4$, $HNO_3$ or HF. The method may further include the step of providing the spin processor in a spin etcher.

The present invention is further directed to an apparatus for removing coating layers from alignment marks on a wafer without damaging IC dies which includes a spin processor equipped with a rotatable wafer pedestal therein, the wafer pedestal is provided with inert gas flow channels for flowing an inert gas in an upward direction; an edge ring mounted on an outer periphery of the wafer pedestal, the edge ring has at least one tab section extending inwardly from an inner periphery of the edge ring toward a center of the ring, each of the at least one tab section has an area sufficiently large to overlap one of the alignment mark on a wafer which when positioned in a faced down position on the edge ring is supported by the inert gas flow from the inert gas flow channels such that each one of the at least one alignment mark on the wafer overlaps and suspends over each one of the at least one tab section on the edge ring by a preset distance of not more than 5 mm; a rotating means for rotating the wafer pedestal at a preset speed; and a nozzle for flowing an etchant onto a backside of the wafer such that the etchant can be drawn into the gap to remove a coating layer on the alignment mark by capillary action.

In the apparatus for removing coating layers from alignment marks on a wafer without damaging IC dies, the coating layer may be Cu or TaN, the inert gas flow may be a nitrogen gas flow. The apparatus may further include a mechanical clamp for holding a wafer in place during a rotation of the wafer pedestal, or means for adjusting the inert gas flow such that the wafer is suspended over the wafer pedestal at a distance between about 0.5 mm and about 5 mm. The preset speed of rotation is between about 20 rpm and about 200 rpm, while the etchant contains an acid selected from the group consisting of $H_2SO_4$, $HNO_3$ and HF. The spin processor may spin etcher or a spin coater.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1A:
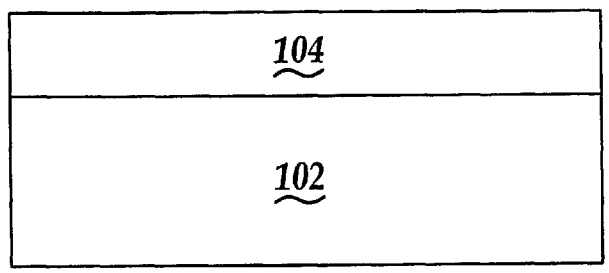
FIGS. 1A and 1B are enlarged, cross-sectional views showing the effect of patterning on a layer deposited on a semiconductor wafer.
Figure 1B:
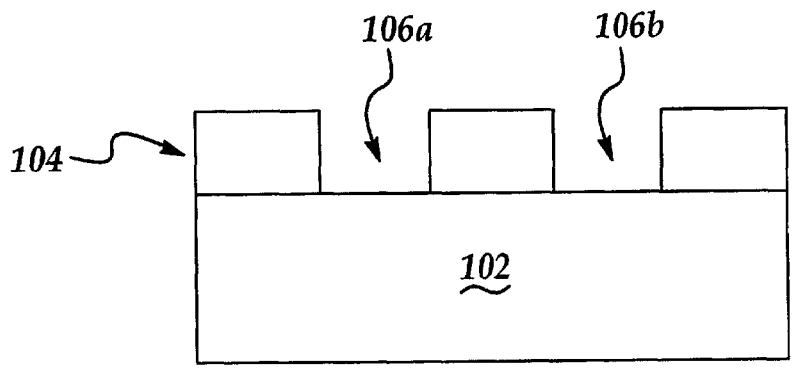
Figure 2:
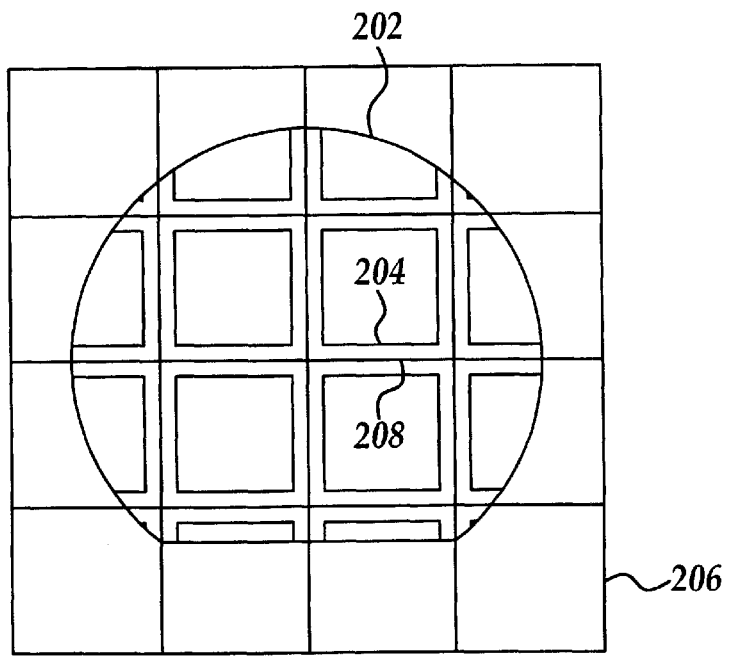
FIG. 2 is an enlarged, cross-sectional view showing the alignment of a mask to a semiconductor wafer.

The present invention discloses a method and apparatus for removing coating layers from alignment marks on a wafer that does not have the drawbacks or shortcomings of the conventional method and apparatus.

The present invention method for removing coating layers from the top of alignment marks on a wafer that is positioned in a spin processor can be carried out by first providing a spin processor equipped with a rotatable wafer pedestal, then providing a wafer that has alignment marks on an active surface covered by a coating layer, then mounting an edge ring on an outer periphery of the wafer pedestal wherein the edge ring is equipped with at least one tab section for overlapping the at least one alignment mark, then positioning the wafer with the active surface face down on the edge ring, while supported by an inert gas flow such that the at least one alignment mark overlaps and suspends over the at least one tab section by a preset distance of not more than 5 mm; and rotating the wafer pedestal and the edge ring while dispensing an etchant onto a backside of the wafer so that the etchant is drawn into the gap to remove the coating layer by capillary action. The coating layer may be formed of a refractory metal, such as tungsten or tantalum, or alloys thereof. The coating layer may also be formed of a material that includes tantalum nitride.

The invention is further directed to an apparatus for removing coating layers from alignment marks on a wafer without damaging IC dies which can be constructed by a spin processor equipped with a wafer pedestal therein, an edge ring mounted on the wafer pedestal wherein the ring is provided with tab sections for overlapping the alignment marks, a rotating means for rotating the wafer pedestal, a mechanical clamp for holding the wafer in place during the rotation, and a nozzle for flowing an etchant onto a backside of the wafer such that the etchant can be drawn into a gap between the coating layer and the alignment mark by capillary action.

The present invention edge ring can be mounted on an undercut chuck of a spin processor. During the coating layer removal process, the wafer is placed face down on the edge ring/chuck assembly with alignment marks aligned with the tab sections of the edge ring. The wafer is supported by an inert gas flown from apertures in the chuck such that the wafer surface is slightly above the surface of the edge ring/chuck assembly. Support pins provided on the wafer chuck hold the wafer on its edge such that the complete assembly spins together when the chuck is rotated. A nozzle dispenses an etchant on the backside of the wafer and, due to capillary action, the etchant is drawn into a narrow gap formed between the wafer edge and the edge ring. In the area of the tab section, the etchant etches away the coating layer that covers the alignment marks. After the coating layer, such as one formed of refractory metal is removed, the alignment marks can be recognized during photolithography and thus, alignment failure and defects caused by misalignment can be avoided. At other areas outside the alignment marks, the etchant only etches away the metal on the wafer bevel and edge. The width of the etched band can be minimized to affect only a minimum number of IC dies.

Figure 4:
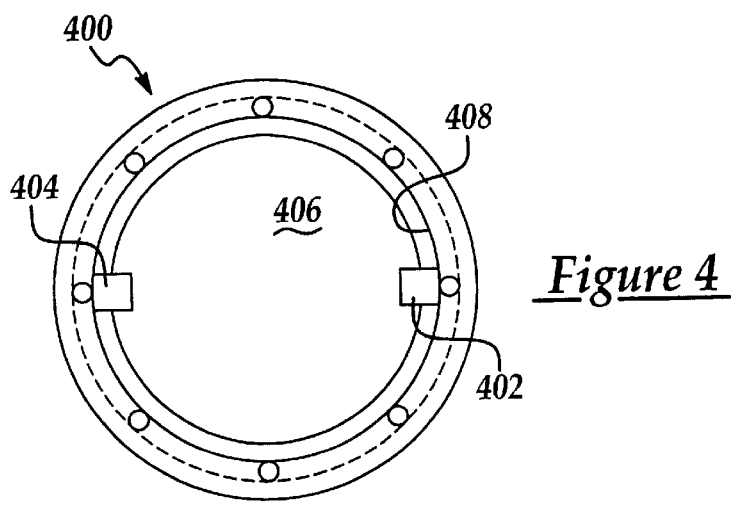
FIG. 4 is a plane view of the present invention edge ring equipped with tab sections for covering alignment marks on a wafer.

Referring now to FIG. 4, wherein a present invention edge ring 400 is shown in a plane view. The edge ring 400 is formed in a thin hollow ring with at least two tab sections 402 and 404. The edge ring may be suitably formed of a high temperature, corrosion-resistant material such as a ceramic compound, stainless steel or teflon. The edge ring 400 fits outside the periphery of a wafer chuck 406 with tab sections 402,404 extending from an inside periphery 408 of the edge ring 400 toward a center of the edge ring. The tab sections 402,404 are formed to a size that is sufficiently large to overlap the alignment marks 502,504 (shown in FIG. 5) completely such that an etchant can be drawn into the gap formed between the edge ring 400 and the wafer surface 506 for removing the coating layer on top of the alignment marks 502,504. A present invention wafer 500 is shown in FIG. 5.

Figure 3:
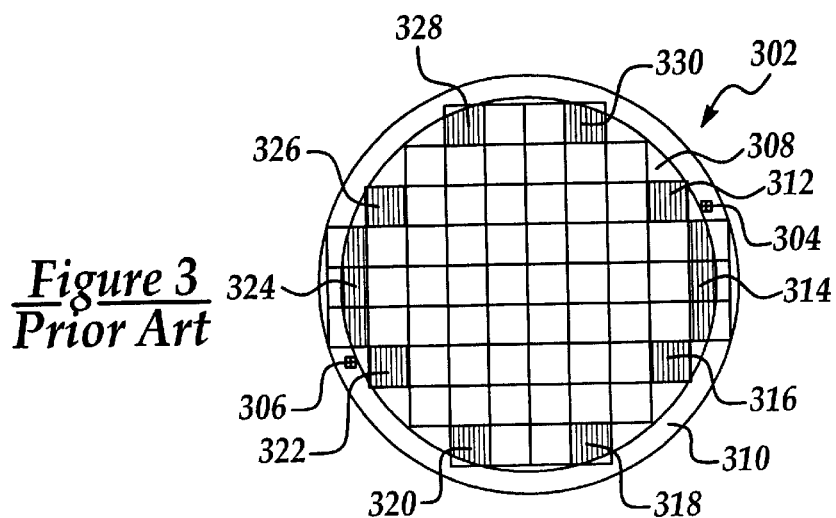
FIG. 3 is a plane view of a wafer having alignment marks on top cleaned by a conventional method of edge rinse.
Figure 5:
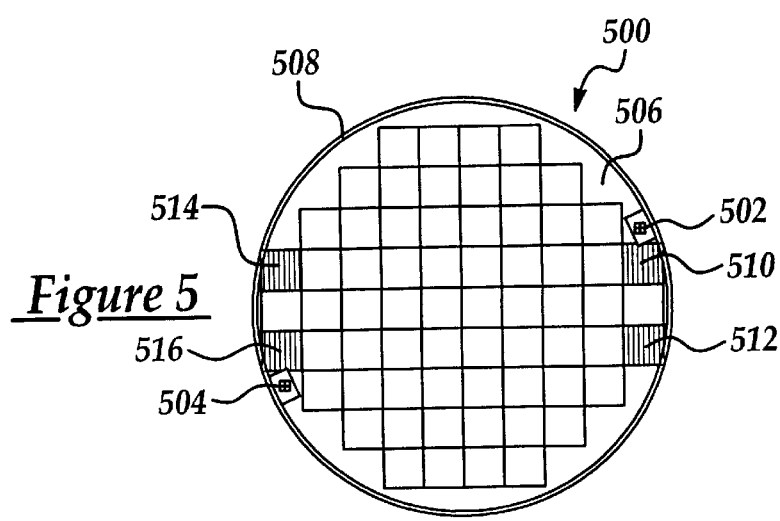
FIG. 5 is a plane view of a wafer having alignment marks on top and cleaned by the present invention method utilizing the edge ring.

FIG. 5 is a plane view of a present invention wafer 500 having an active surface 506 with two alignment marks 502,504 formed thereon. By using the present invention novel edge ring 400 shown in FIG. 4 for a spin cleaning process, only a narrow band 508 within which the coating layer is removed. As a result, only four IC dies 510, 512, 514 and 516 are damaged by the coating layer removal process and are lost. This is a significant improvement when compared to the conventional method, shown in FIG. 3, wherein a total of fourteen IC dies, i.e. dies 314–330, are lost.

Figure 6A:
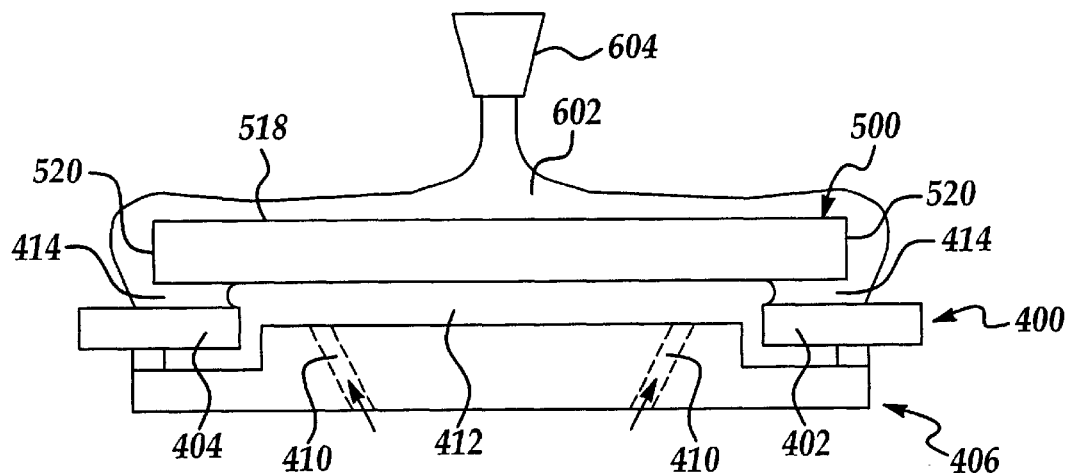
FIG. 6A is a cross-sectional view of the present invention edge ring positioned on a wafer pedestal.
Figure 6B:
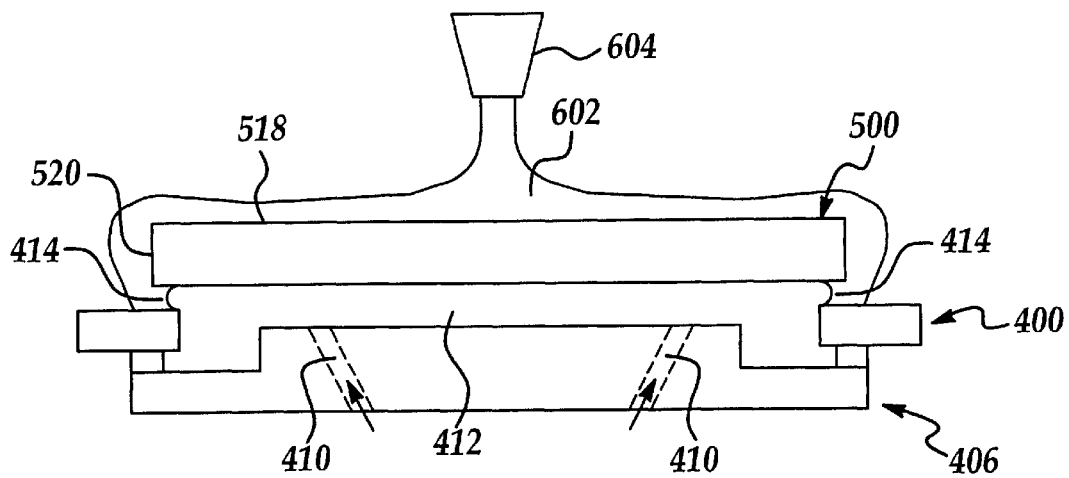
FIG. 6B is a cross-sectional view of the present invention edge ring positioned on a wafer pedestal of FIG. 6A taken in a perpendicular direction.

Referring now to FIGS. 6A and 6B, wherein cross-sectional sectional views taken in two perpendicular directions of the present invention edge ring 400, wafer chuck 406 and wafer 500 are shown. The wafer chuck, or wafer pedestal 406, is provided with a plurality of apertures 410 for flowing an inert gas flow into a gap 412 formed between the wafer 500 and the wafer chuck 406. As shown in FIGS. 6A and 6B, the inert gas flow raises the wafer 500 and thus suspends the wafer over the edge ring 400 with a gap 414 therein between. In the preferred embodiment of the present invention, a suitable gap 414 is found to be between about 0.5 mm and about 5 mm, and preferably between about 1 mm and about 3 mm in order to form a capillary effect. When an etchant 602 is dispensed from a nozzle 604 onto the backside 518 of the wafer 500, and while the wafer 500 is rotated by the wafer chuck 406 at a suitable rotational speed, the etchant 602 flows onto the backside 518 of the wafer 500and over the edge 520 to enter gap 414 formed between the wafer 500 and the edge ring 400 due to a capillary action. The gap 414 should have a suitable value, as previously mentioned, in order for the capillary action to take place. A suitable rotational speed of the wafer 500 can be between about 20 rpm and about 200 rpm, and can be adjusted to compensate for the capillary action occurring at gap 414. For instance, the slower the rotational speed of the wafer 500, the more capillary force to suck in the etchant 602 at gap 414 will take place.

A similar cross-sectional view of the present invention edge ring 400 placed on top of a wafer chuck 406 is shown in FIG. 6B taken in a cross-section that is perpendicular to that shown in FIG. 6A. It should be noted that in this cross-sectional view, the edge ring 400 does not show the tab sections 402,404 (shown in FIG. 4). Since FIG. 6A is taken along cross-section AA, while FIG. 6B is taken along cross-section BB of FIG. 4. A suitable etchant 602 may be one that contains at least one acid such as $H_2SO_4$, $HNO_3$ or HF. For instance, for removing a coating layer of Cu, an etchant mixture of $H_2SO_4$, $H_2O_2$ and $H_2O$ may be used. For removing a coating layer of TaN, an etchant mixture of $HNO_3$, HF and $H_2O$ may be used. Depending on the coating material to be removed, any other suitable etchant mixture may be used in the present invention method.

the present invention novel method and apparatus for removing coating layers from alignment marks on a wafer have therefore been amply described in the above description and in the appended drawings of FIGS. 4–6B.

while the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for removing coating layers from the top of alignment marks on a wafer positioned in a spin processor comprising the steps of:

providing a spin processor equipped with a rotatable wafer chuck therein, said wafer chuck being provided with inert gas flow channels for flowing an inert gas in an upward direction;

providing a wafer having at least one alignment mark on an active surface, said at least one alignment mark being covered with a coating layer;

mounting an edge ring on an outer periphery of said wafer chuck, said edge ring having at least one tab section extending outwardly from an inner periphery of said edge ring toward a center of the ring, each of said at least one tab section having an area sufficiently large to overlap one of said at least one alignment mark;

positioning said wafer with said active surface in a faced down position on said edge ring supported by said inert gas flow from said inert gas flow channels such that each one of said at least one alignment mark on said wafer overlaps and suspends over each one of said at least one tab section on said edge ring by a preset distance of not more than 5 mm; and rotating said wafer chuck and said edge ring with said wafer suspended thereon and flowing an etchant onto a backside of said wafer such that said etchant being drawn into said gap to remove said coating layer on the at least one alignment mark by capillary action.

2. A method for removing coating layers from the top of alignment marks on a wafer positioned in a spin processor according to claim 1, wherein said coating layer on said alignment mark is an electroplated Cu layer.

3. A method for removing coating layers from the top of alignment marks on a wafer positioned in a spin processor according to claim 1 further comprising the step of flowing $N_2$ gas upwardly through said wafer chuck to support said wafer suspended over said wafer chuck.

4. A method for removing coating layers from the top of alignment marks on a wafer positioned in a spin processor according to claim 1 further comprising the step of clamping said wafer by a mechanical clamp during said rotating step.

5. A method for removing coating layers from the top of alignment marks on a wafer positioned in a spin processor according to claim 1 further comprising the step of supporting said wafer suspended over said wafer chuck maintaining a distance between said wafer and said edge ring at between about 0.5 mm and about 5 mm.

6. A method for removing coating layers from the top of alignment marks on a wafer positioned in a spin processor according to claim 1 further comprising the step of rotating said wafer chuck at a rotational speed between about 20 rpm and about 200 rpm.

7. A method for removing coating layers from the top of alignment marks on a wafer positioned in a spin processor according to claim 1 further comprising the step of flowing an etchant that contains an acid selected from the group consisting of $H_2SO_4$, $HNO_3$ and HF.

8. A method for removing coating layers from the top of alignment marks on a wafer positioned in a spin processor according to claim 1 further comprising the step of providing said spin processor in a spin etcher.

9. An apparatus for removing coating layers from alignment marks on a wafer without damaging IC dies comprising;

a spin processor equipped with a rotatable wafer pedestal therein, said wafer pedestal being provided with inert gas flow channels for flowing an inert gas in an upward direction;

an edge ring mounted on an outer periphery of said wafer pedestal, said edge ring having at least one tab section extending outwardly from an inner periphery of said edge ring toward a center of the ring, each of said at least one tab section having an area sufficiently large to overlap one of at least one alignment mark on a wafer which when positioned in a faced down position on said edge ring is supported by said inert gas flown from said inert gas flow channels such that each one of said at least one alignment mark on said wafer overlaps and suspends over each one of said at least one tab section on said edge ring by a preset distance of not more than 5 mm;

a rotating means for rotating said wafer pedestal at a preset speed; and a nozzle for flowing an etchant onto a backside of said wafer such that said etchant can be drawn into said gap to remove a coating layer on the alignment mark by capillary action.

10. An apparatus for removing coating layers from alignment marks on a wafer without damaging IC dies according to claim 9, wherein said coating layer is Cu or TaN.

11. An apparatus for removing coating layers from alignment marks on a wafer without damaging IC dies according to claim 9, wherein said inert gas flow is a nitrogen gas flow.

12. An apparatus for removing coating layers from alignment marks on a wafer without damaging IC dies according to claim 9 further comprising a mechanical clamp for holding a wafer in place during a rotation of said wafer pedestal.

13. An apparatus for removing coating layers from alignment marks on a wafer without damaging IC dies according to claim 9 further comprising means for adjusting said inert gas flow such that said wafer is suspended over said wafer pedestal at a distance between about 0.5 mm and about 5 mm.

14. An apparatus for removing coating layers from alignment marks on a wafer without damaging IC dies according to claim 9, wherein said preset speed is between about 20 rpm and about 200 rpm.

15. An apparatus for removing coating layers from alignment marks on a wafer without damaging IC dies according to claim 9, wherein said etchant contains an acid selected from the group consisting of $H_2SO_4$, $HNO_3$ and HF.

16. An apparatus for removing coating layers from alignment marks on a wafer without damaging IC dies according to claim 9, wherein said spin processor is a spin etcher.

17. An apparatus for removing coating layers from alignment marks on a wafer without damaging IC dies according to claim 9, wherein said spin processor is a spin coater.

* * * * *